United States Patent
Feldman et al.

(10) Patent No.: US 10,243,541 B2
(45) Date of Patent: *Mar. 26, 2019

(54) PASSIVE AUTOMATIC ANTENNA TUNING BASED ON RECEIVED-SIGNAL ANALYSIS

(71) Applicant: Altair Semiconductor Ltd., Hod Hasharon (IL)

(72) Inventors: Dima Feldman, Ramat Hasharon (IL); Yigal Bitran, Ramat Hasharon (IL); Ariel Yagil, Ein Sarid (IL)

(73) Assignee: ALTAIR SEMICONDUCTOR LTD., Hod Hasharon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/806,341

(22) Filed: Nov. 8, 2017

(65) Prior Publication Data

US 2018/0062624 A1     Mar. 1, 2018

Related U.S. Application Data

(63) Continuation of application No. 14/873,222, filed on Oct. 2, 2015, now Pat. No. 9,843,307, which is a
(Continued)

(51) Int. Cl.
*H03F 1/32*    (2006.01)
*H03J 7/02*    (2006.01)
*H04B 1/04*    (2006.01)
*H04W 52/02*   (2009.01)
*H04W 76/28*   (2018.01)

(52) U.S. Cl.
CPC .............. *H03J 7/02* (2013.01); *H03F 1/3241* (2013.01); *H04B 1/0458* (2013.01); *H04B 2001/0425* (2013.01); *H04W 52/0229* (2013.01); *H04W 76/28* (2018.02); *Y02D 70/00* (2018.01); *Y02D 70/1242* (2018.01); *Y02D 70/1262* (2018.01); *Y02D 70/1264* (2018.01); *Y02D 70/142* (2018.01); *Y02D 70/144* (2018.01);
(Continued)

(58) Field of Classification Search
CPC . H03J 7/02; H04B 1/0458; H04B 2001/0425; H04W 52/0229; H04W 76/048
See application file for complete search history.

(56) References Cited

U.S. PATENT DOCUMENTS

| 9,843,307 B2* | 12/2017 | Feldman | H03J 7/02 |
| 2004/0196930 A1* | 10/2004 | Molnar | H04B 7/0613 |
| | | | 375/344 |
| 2007/0285326 A1* | 12/2007 | McKinzie | H01Q 9/0407 |
| | | | 343/746 |
| 2009/0167604 A1* | 7/2009 | Roberts | H01Q 3/26 |
| | | | 342/368 |
| 2009/0256747 A1* | 10/2009 | Shibuya | H04B 7/0814 |
| | | | 342/367 |

(Continued)

FOREIGN PATENT DOCUMENTS

WO     2007104343 A1     9/2007

OTHER PUBLICATIONS

European Application # 15848814.8 search report dated Jun. 12, 2018.

*Primary Examiner* — Nguyen T Vo
(74) *Attorney, Agent, or Firm* — Kligler & Associates

(57) ABSTRACT

A method includes receiving a signal from a remote transmitter via an electrically-tunable antenna having a tunable element. An adjustment, to be applied to a response of the electrically-tunable antenna, is calculating by analyzing the received signal. The response of the electrically-tunable antenna is adapted by controlling the tunable element responsively to the estimated adjustment.

18 Claims, 4 Drawing Sheets

Related U.S. Application Data continuation-in-part of application No. 14/708,255, filed on May 10, 2015, now Pat. No. 9,438,279, which is a continuation of application No. PCT/IB2015/053341, filed on May 7, 2015.

(60) Provisional application No. 62/060,600, filed on Oct. 7, 2014, provisional application No. 61/991,628, filed on May 12, 2014.

(52) U.S. Cl.
CPC ............ *Y02D 70/164* (2018.01); *Y02D 70/24* (2018.01); *Y02D 70/26* (2018.01); *Y02D 70/40* (2018.01)

(56) References Cited

U.S. PATENT DOCUMENTS

| | | | |
|---|---|---|---|
| 2012/0064894 A1 | 3/2012 | Liu et al. | |
| 2012/0220243 A1* | 8/2012 | Mendolia | H04B 1/0458 455/77 |
| 2012/0295555 A1* | 11/2012 | Greene | H04B 1/0458 455/77 |
| 2013/0196610 A1 | 8/2013 | Sanji et al. | |
| 2013/0217327 A1* | 8/2013 | Kanno | H04B 5/0056 455/41.1 |
| 2013/0309980 A1* | 11/2013 | Seth | H03J 5/00 455/77 |
| 2014/0038662 A1* | 2/2014 | Alberth, Jr. | H01P 1/18 455/550.1 |

\* cited by examiner

US 10,243,541 B2

PASSIVE AUTOMATIC ANTENNA TUNING BASED ON RECEIVED-SIGNAL ANALYSIS

CROSS-REFERENCE TO RELATED APPLICATIONS

This application is a continuation of U.S. patent application Ser. No. 14/873,222, filed Oct. 2, 2015, which claims the benefit of U.S. Provisional Patent Application 62/060,600, filed Oct. 7, 2014, and is also a continuation-in-part of U.S. patent application Ser. No. 14/708,255, filed May 10, 2015, which is a continuation of PCT Application PCT/IB2015/053341, filed May 7, 2015, which claims the benefit of U.S. Provisional Patent Application 61/991,628, filed May 12, 2014. The disclosures of all these related applications are incorporated herein by reference.

FIELD OF THE INVENTION

The present invention relates generally to wireless receivers and transceivers, and particularly to automatic antenna tuning.

BACKGROUND OF THE INVENTION

Many wireless devices are constrained to a small volume, and therefore use Electrically-Small Antennas (ESAs). An ESA has physical dimensions that are small relative to the free-space wavelength $\lambda$. One example definition regards an antenna as electrically small if it is able to fit in a sphere of radius $\lambda/2\pi$.

Electrically-Small Antennas are described, for example, by Wheeler, in "Fundamental Limitations of Small Antennas," Proceedings of The IRE, volume 35, issue 12, December, 1947, pages 1479-1484; by Wheeler, in "The Radiansphere Around a Small Antenna," Proceedings of The IRE, volume 47, issue 8, August, 1959, pages 1325-1331; and by McLean, in "A Re-Examination of the Fundamental Limits on The Radiation Q of Electrically Small Antennas," IEEE Transactions on Antennas and Propagation, volume 44, issue 5, May, 1996, pages 672-675, which are all incorporated herein by reference.

SUMMARY OF THE INVENTION

An embodiment of the present invention that is described herein provides a method including receiving a signal from a remote transmitter via an electrically-tunable antenna having a tunable element. An adjustment, to be applied to a response of the electrically-tunable antenna, is calculating by analyzing the received signal. The response of the electrically-tunable antenna is adapted by controlling the tunable element responsively to the estimated adjustment.

In some embodiments, calculating the adjustment and adapting the response include carrying out an iterative tuning process that aims to maximize a level of the received signal. In an embodiment, the received signal includes known signal components, and calculating the adjustment includes deriving the adjustment from measured received levels of the known signal components.

In a disclosed embodiment, calculating the adjustment includes estimating a slope of the response as a function of frequency over a frequency range, and deriving the adjustment from the estimated slope. In another embodiment, calculating the adjustment includes estimating a change in a slope of the response as a function of frequency between at least first and second settings of the tunable element, and deriving the adjustment from the estimated change in the slope.

In some embodiments, calculating the adjustment includes measuring respective levels of the received signal for at least first and second settings of the tunable element, and deriving the adjustment by comparing the received levels. In an example embodiment, measuring the levels includes performing a first measurement of the first setting, and performing second measurements of the second setting before and after the first measurement, and comparing the received levels includes comparing the first measurement to a combination of the second measurements.

In another embodiment, calculating the adjustment includes evaluating two or more different settings of the tunable element during a single symbol of the received signal. In yet another embodiment, receiving the signal includes receiving a sequence of communication time frames, and adapting the response includes controlling the tunable element at boundaries between the time frames.

In still another embodiment, receiving the signal includes operating a receiver that receives the signal in an intermittent reception mode, and the method includes waking-up the receiver in order to calculate the adjustment in response to meeting a predefined wake-up criterion. In a disclosed embodiment, the received signal is transmitted from a first base station on a first frequency, and calculating the adjustment includes predicting a setting of the tunable element to be used when receiving a subsequent signal from a second base station on a second frequency. In an embodiment, the method includes calculating, based on the adapted response, an antenna tuning setting to be used for signal transmission.

There is additionally provided, in accordance with an embodiment of the present invention, an apparatus including an electrically-tunable antenna, a receiver and control circuitry. The electrically-tunable antenna includes a tunable element. The receiver is configured to receive a signal from a remote transmitter via the electrically-tunable antenna. The control circuitry is configured to calculate an adjustment to be applied to a response of the electrically-tunable antenna by analyzing the received signal, and to adapt the response of the electrically-tunable antenna by controlling the tunable element responsively to the estimated adjustment.

The present invention will be more fully understood from the following detailed description of the embodiments thereof, taken together with the drawings in which:

DETAILED DESCRIPTION OF EMBODIMENTS

Overview

Figure 1:
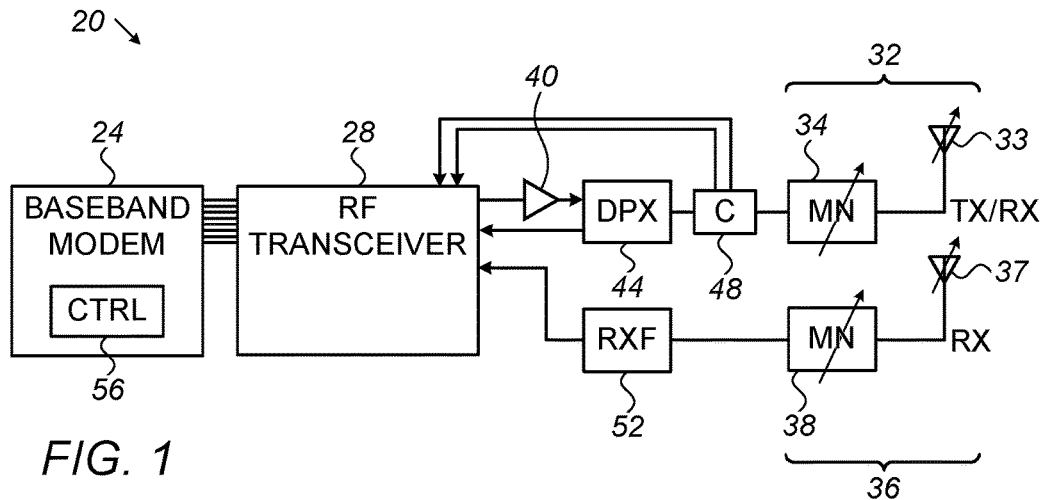
FIGS. 1-3 are block diagrams that schematically illustrate wireless communication devices with adaptively-tunable antennas, in accordance with embodiments of the present invention.

Embodiments of the present invention that are described herein provide improved techniques for adaptive tuning of antennas in wireless communication devices. Although the embodiments described herein refer mainly to adaptively-tunable Electrically-Small Antennas (ESAs), which are typically narrowband and can benefit significantly from adaptive tuning, the disclosed techniques are applicable to any other suitable type of antenna.

In some embodiments, a wireless device comprises at least one adaptively-tunable antenna that is used for signal reception and possibly also for transmission. A receiver, which is possibly part of a transceiver, processes a signal that is received from a remote transmitter via the antenna. A control unit analyzes the received signal and tunes the antenna in response to the analyzed received signal. Tuning may involve impedance tuning, aperture tuning, and/or other suitable form of tuning, as will be described below.

The disclosed tuning schemes are entirely passive, in the sense that they do not use or require any signal transmission. This property is in contrast, for example, to tuning schemes that are based on Voltage Standing Wave Ratio (VSWR) measurements. In some embodiments, however, the disclosed techniques can be used in combination with active, e.g., VSWR-based, tuning schemes.

Antenna tuning based on the received signal has numerous important advantages. In many cases a transmitted signal is not present at all, or at least for long periods of time. For example, some wireless devices use receive-only antennas that are not used for transmission at all. In other cases, an antenna is used for transmission occasionally, but there are long periods of time during which no signal is transmitted (e.g., when the device is idle, during long paging cycles, during acquisition of system information, during measurement of downlink signals, to name just a few examples).

In yet other cases, tuning an antenna based on the transmitted signal is not optimal, and sometimes unsuitable, for reception performance. For example, in some communication protocols transmission and reception are performed on different frequencies, and therefore tuning an antenna on the transmission frequency does not guarantee acceptable reception performance. Tuning the antenna based on the received signal is optimal, in the sense that is aims to maximize the reception performance on the actual reception frequencies and using the actual signal to be received. In addition, reception-based tuning typically optimizes the antenna performance and guarantees the strongest possible received signal, whereas VSWR-based tuning typically converges to the minimal returned signal power and is unable to tightly control the energy dissipated in the antenna itself.

Typically, the control unit in the wireless device carries out the disclosed tuning schemes continuously and at a fast rate, in order to track and compensate for time-varying effects such as body effects. Fast and continuous tuning is also important because the received signal may be subject to fast channel fading.

In some embodiments, the tuning scheme aim to center the frequency response of the antenna (e.g., the antenna resonance frequency) on the actual reception frequency. In an embodiment, the control unit estimates the slope of the antenna response as a function of frequency, or the change in slope from one tuning setting to another. The estimated slope is then used for deciding how to adapt the frequency response, e.g., whether to increase or decrease the antenna center frequency and by what increment. An example method that estimates the slope by analyzing Reference Signals (RSs) in different frequency bins is described in detail.

Wireless Devices with Adaptively-Tunable Electrically-Small Antennas

In some embodiments, a disclosed wireless communication device comprises one or more Electrically-Small Antennas (ESAs) used for transmission and/or reception. In the context of the present patent application and in the claims, the term "ESA" refers to an antenna whose volume is confined to a sphere of radius $\lambda/2\pi$, wherein $\lambda$ denotes the free-space wavelength of signals transmitted or received by the antenna.

ESAs are by nature narrowband, and their bandwidth typically decreases with physical size. For many wireless communication applications, the instantaneous bandwidth of an ESA (e.g., on the order of no more than 6% of the center frequency) is considerably narrower than the end-to-end bandwidth of the transmission and reception bands (sometimes on the order of 5-25% of the center frequency).

In order to use narrowband ESAs in broadband wireless communication applications, the wireless device's ESAs in the disclosed embodiments are adaptively tunable. In an embodiment, the device further comprises a control unit that adaptively tunes the frequency response of the ESA to the specific narrowband frequency slice that is actually used for signal transmission or reception. When using such an adaptively-tunable ESA, the instantaneous bandwidth of the ESA is only required to correspond to the instantaneous bandwidth of the transmitted or received signal (usually no more than 20 MHz).

In the context of the present patent application and in the claims, the term "adaptively-tunable antenna" refers to an antenna whose frequency response can be adjusted during device operation, as opposed to tuning during production. The antenna response can be tuned adaptively to match a desired frequency slice or sub-band of operation, possibly under varying conditions and circumstances. The tunable element or elements in an adaptively-tunable antenna may comprise or be coupled to the physical radiating elements of the antenna, and/or associated circuitry. The antenna may comprise any suitable tuning mechanisms, such as, for example, an aperture tuning mechanism, an impedance matching network, and/or a mechanism that adaptively connects or disconnects one or more antenna elements. The tuning scheme can be used for tuning to the desired frequency slice, as well as for compensating for various effects that degrade the antenna performance or shift the antenna oscillation frequency, such as body effects.

Various example configurations of wireless devices with adaptively-tunable ESAs are described herein. In one embodiment, the device comprises a transmit/receive (TX/RX) antenna and a receive-only (RX) antenna, both adaptively tunable. The RX antenna is tuned to the desired RX sub-band, and the TX/RX antenna is tuned to the desired TX sub-band. On reception, the device performs diversity reception with the RX-only antenna serving as the primary antenna and the TX/RX antenna serving as the diversity antenna. Since the TX/RX antenna is tuned to the TX sub-band, its gain and efficiency in the RX sub-band are degraded. This degradation, however, is tolerable when serving as a diversity antenna.

In another embodiment, the device comprise only a single adaptively-tunable ESA used for both transmission and reception. When using Frequency-Division Duplex (FDD), for example, this TX/RX antenna may be tuned so as to balance transmission and reception performance. Alternatively, e.g., when using Time-Division Duplex (TDD) or Half-Duplex Frequency Division Duplex (HFDD or HD-FDD), the control unit may tune the antenna alternately to the TX and RX sub-bands as needed.

Several additional device configurations are described herein. Various tuning schemes, and metrics that can be used by the control unit for tuning the ESAs, are also described.

The methods and devices described herein enable the use of physically small antennas in broadband wireless applications, with improved performance for a given antenna volume, or with smaller volume for a given performance level. The disclosed techniques can be applied in any suitable wireless devices, and are particularly attractive in small-size devices such as mobile phones and wearable devices such as smart watches and glasses.

System Description

FIG. 1 is a block diagram that schematically illustrates a wireless communication device 20, in accordance with an embodiment of the present invention. Device 20 may comprise, for example, a mobile phone, a smartphone, a smart wearable device such as smart watch or smart glasses, a device used in an Internet-of-Things (IoT) application, or any other suitable wireless device.

Device 20 may communicate over any suitable wireless network and in accordance with any suitable communication protocol or air interface. Example protocols comprise cellular protocols such as Wideband Code-Division Multiple Access (WCDMA), Long-Term Evolution (LTE) and LTE-Advanced (LTE-A), or Wireless Local-Area Network (WLAN) protocols such as the various IEEE 802.11 protocols, Alternatively, any other suitable protocol can be used. Device 20 may operate on any suitable transmission (TX) and reception (RX) bands, and using any suitable multiple access scheme, e.g., Frequency-Division Duplex (FDD), Time-Division Duplex (TDD) or Half-duplex FDD (HFDD).

Although the embodiments described herein refer to wireless communication devices, the disclosed techniques can also be used in other kinds of transceivers or receivers, such as navigation receivers operating in accordance with location standards such as GPS and GLONASS.

In the present example, device 20 comprises a baseband modem 24 that carries out the baseband processing functions of the device, and a Radio Frequency (RF) transmitter-receiver (transceiver) 28 that performs RF transmission and reception. Device 20 comprises two ESAs—a TX/RX antenna 33 and a RX-only antenna 37. Antennas 33 and 37 may comprise any suitable type of ESA, such as, for example, Inverted-F Antenna (IFA), Planar Inverted-F Antenna (PIFA), meander line antenna, or any other suitable antenna type.

On transmission, baseband modem 24 generates a modulated baseband or low-Intermediate-Frequency (IF) signal in accordance with the applicable communication protocol. RF transceiver 28 up-converts the signal to RF, and outputs a TX signal in a certain frequency slice in the appropriate TX band. A Power Amplifier (PA) 40 amplifies the TX signal, and a duplexer 44 filters the amplified signal. The signal then passes through a directional coupler 48 that senses the forward and reverse power levels. Following the coupler, the signal passes through a tunable Matching Network (MN) 34, and finally transmitted via antenna 33.

On reception, an RX signal is received from a remote transmitter (e.g., from a base station) both by TX/RX antenna 33 and by RX antenna 37. In the reception chain of TX/RX antenna 33, the RX signal passes through MN 34 and coupler 48. The RX signal is then filtered by duplexer 44 and provided to RF transceiver 28. Transceiver 28 down-converts the RX signal, e.g., to baseband or to some Intermediate Frequency (IF), and provides the down-converted signal to modem 24 for further processing and decoding.

In the reception chain of RX antenna 37, the RX signal passes through a tunable MN 38, and is then filtered by a receive filter 52. The filtered signal is provided to RF transceiver 28, which down-converts it and provides the down-converted signal to modem 24 for processing and decoding.

In the embodiment of FIG. 1, baseband modem 24 comprises a control unit 56 that performs various control and management functions. Among other tasks, control unit 56 tunes MNs 34 and 38, and also reads the forward and reverse power levels using coupler 48. These tasks are used in tuning the tunable TX/RX and RX-only antennas, as will be described in greater detail below. In the present context, antenna 33 and MN 34 are regarded jointly as an adaptively-tunable TX/RX antenna 32. Similarly, antenna and MN 38 are regarded jointly as an adaptively-tunable RX antenna 36.

In a typical embodiment, signal measurements used for antenna tuning are performed by RF transceiver 28 and provided to control unit 56. Control functions, e.g., tuning the antennas based on the measurements, are performed by control unit 56 in the baseband modem. In the context of the present patent application and in the claims, control unit 56 and the circuitry in RF transceiver 24 that performs signal measurements are referred to collectively as "control circuitry." In this embodiment, phrases such as "control unit 56 measures a signal" mean that RF transceiver 28 measures the signal under control of unit 56. In alternative embodiments, the functionality of the control circuitry may be partitioned between the baseband modem and the RF transceiver in any desired manner, or even performed exclusively only in the baseband modem, or only in the RF transceiver.

Figure 2:
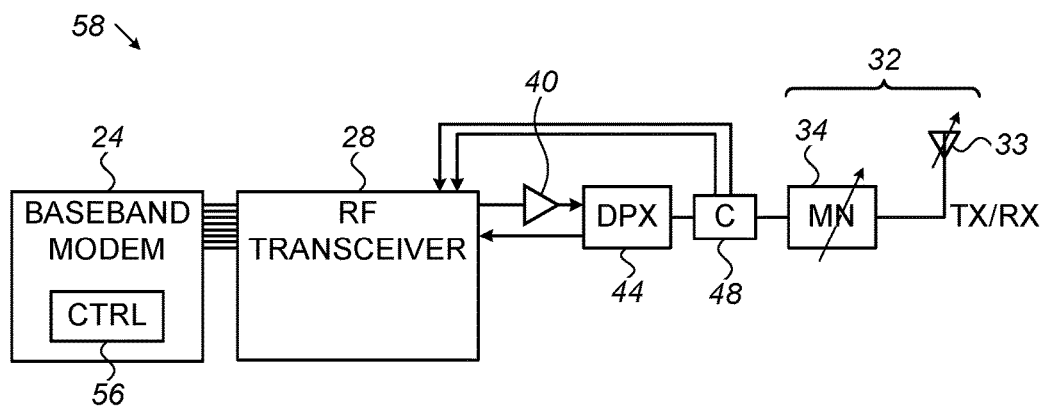

FIG. 2 is a block diagram that schematically illustrates a wireless communication device 58, in accordance with an alternative embodiment of the present invention. Unlike device 20 of FIG. 1, device 58 comprises only a single antenna—Adaptively tunable TX/RX ESA 32.

Figure 3:
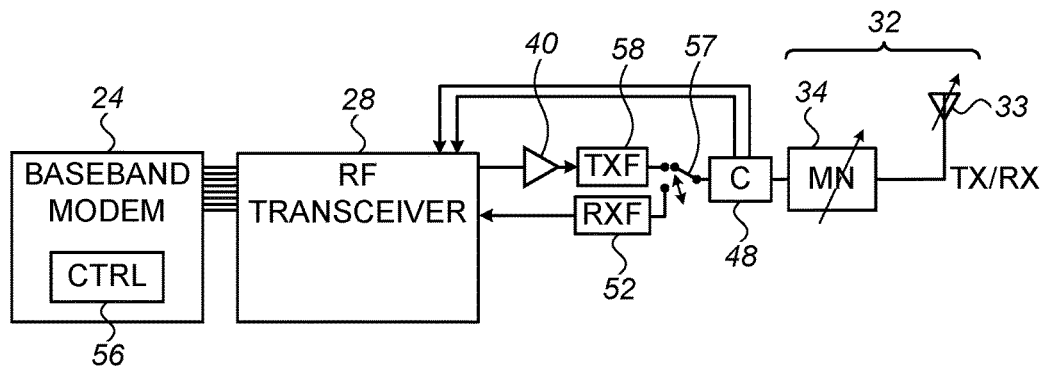

FIG. 3 is a block diagram that schematically illustrates a wireless communication device, in accordance with yet another embodiment of the present invention. This implementation is suitable, for example, for applications in which transmission and reception are not performed simultaneously, such as TDD and HFDD.

In the embodiment of FIG. 3, duplexer 44 is replaced by a Transmit-Receive (T-R) switch 57, and optional receive filter (RXF) 52 and transmit filter (TXF) 58. An additional optional filter (not shown in the figure) may be inserted between RF transceiver 28 and PA 40.

The configurations of the wireless devices shown in FIGS. 1-3, and their various elements, are example configurations that are chosen purely for the sake of conceptual clarity. In alternative embodiments, any other suitable configurations can be used. For example, the wireless device may comprise any other suitable number of TX/RX antennas and any other suitable number of RX-only antennas, one or more of which antennas being adaptively tunable. As another example, control unit 56 may be implemented in baseband modem 24 rather than in RF transceiver 28, or in any other suitable unit of the wireless device or its host system.

The different elements of the various wireless devices of FIGS. 1-3 may be implemented using suitable hardware, e.g., using one or more Application-Specific Integrated Circuits (ASICs), Field-Programmable Gate Arrays (FPGAs) and/or RF Integrated Circuits (RFICs), using software, or using a combination of hardware and software elements.

In some embodiments, control unit 56 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Use of Adaptively-Tunable Electrically-Small Antennas

As explained above, Electrically-Small Antennas (ESAs) are characteristically narrowband, and this property limits their usability and achievable performance. Consider, for example, a typical FDD application in which transmission and reception are performed in respective different TX and RX bands separated by a guard band.

Figure 4A:
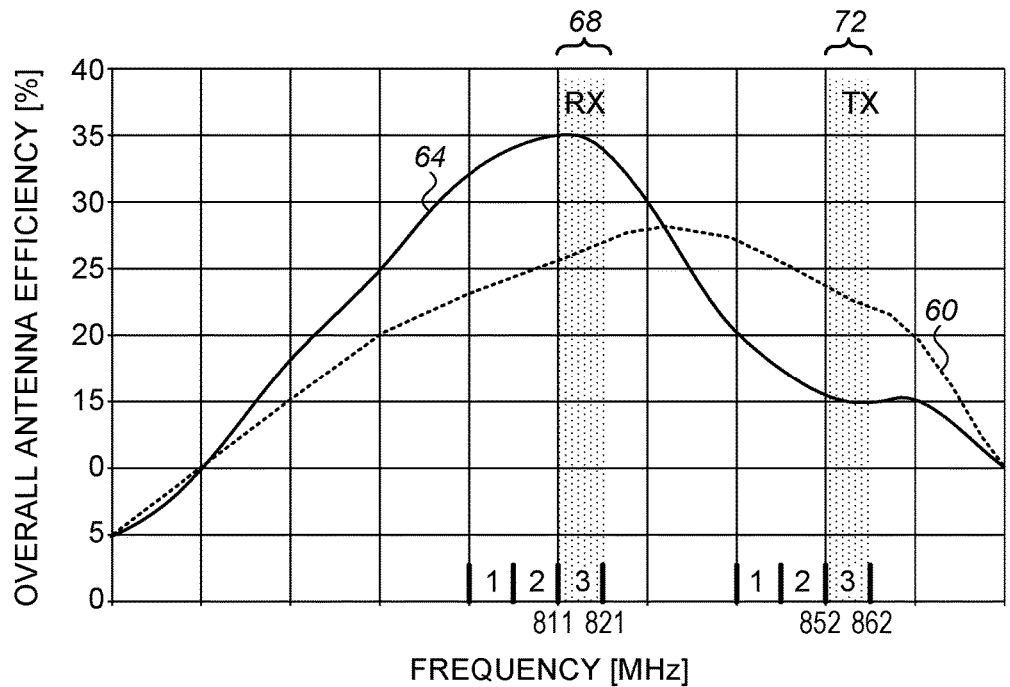
FIGS. 4A and 4B are graphs showing efficiencies of electrically-small antennas, in accordance with an embodiment of the present invention.
Figure 4B:
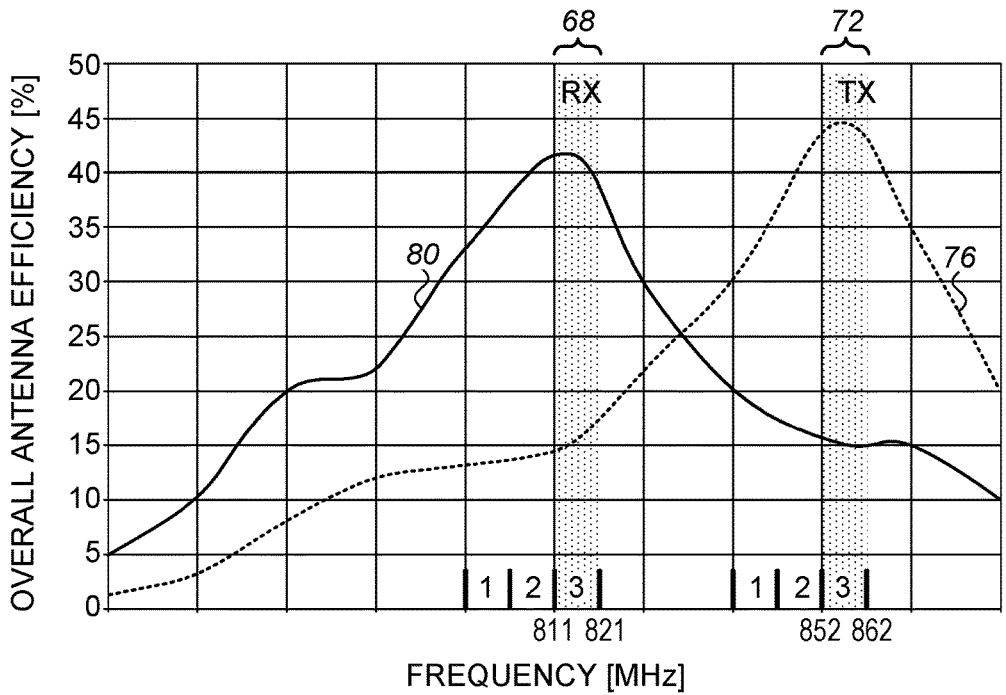

FIGS. 4A and 4B are graphs showing efficiencies of electrically-small antennas, in accordance with an embodiment of the present invention. FIG. 4A shows the performance of a possible conventional solution, whereas FIG. 4B shows the performance of adaptively-tunable ESAs and 36 of FIG. 1 above, in accordance with an embodiment of the present invention.

Both figures address an FDD application in which the RX band lies between 791-821 MHz, and the TX band lies between 832-862 MHz. The RX and TX bands are separated by an 11 MHz-wide guard band. Within these bands, the wireless device receives a 10 MHz-wide RX signal in an RX slice 68, and transmits a 10 MHz-wide TX signal in a TX slice 72. The RX band comprises three possible 10 MHz-wide receive slices marked "1", "2" and "3" in the figure, and the TX band comprises three corresponding 10 MHz-wide transmit slices marked "1", "2" and "3". In this example, the active channel is slice "3", which is shaded in the figure. The frequencies and bandwidths above are given purely by way of example, and any other frequencies and bandwidths can be used in alternative embodiments.

In the possible conventional solution of FIG. 4A, a dashed curve 60 shows the efficiency of a TX/RX antenna, and a solid curve 64 shows the efficiency of an RX antenna. The TX/RX antenna is tuned for maximal efficiency in the guard band (see curve 60), so that the instantaneous bandwidth of the antenna would cover the RX band and the TX band simultaneously. The RX antenna (see curve 64) is tuned so that its instantaneous bandwidth would cover the entire RX band. As can be seen in the figure, this tuning scheme comes at the expense of poor efficiency of both antennas in both bands.

In FIG. 4B, a dashed curve 76 shows the efficiency of adaptively-tunable TX/RX antenna 32, and a solid curve 80 shows the efficiency of adaptively-tunable RX antenna 36, in accordance with an embodiment of the present invention. Adaptively-tunable TX/RX antenna 32 is tuned for maximum efficiency over the actual 10 MHz-wide slice 72 used for transmitting the TX signal at this particular point in time, rather than over the entire 30 MHz-wide TX band or over both TX and RX bands. Adaptively-tunable RX antenna 36 is tuned for maximum efficiency over the actual 10 MHz-wide slice 68 used for receiving the RX signal at this particular point in time, rather than over the entire 30 MHz-wide RX band.

The improvement in performance achieved by the disclosed technique can be appreciated by comparing the corresponding efficiency curves in FIGS. 4A and 4B. In this particular example, TX/RX antenna 32 has an efficiency of ~40-45% in slice 72, as opposed to 22-25% in the conventional solution. RX antenna 36 has an efficiency of ~40-42% in slice 68, as opposed to 34-35% in the conventional solution.

It should be noted that the efficiency of TX/RX antenna 32 drops to ~15% in RX band 68, even though it is used for reception as well. In practice, however, when the device is configured to receive using multiple antennas, degraded reception performance can be tolerated in one of them.

For example, in some embodiments device 20 of FIG. 1 performs diversity reception, wherein RX antenna 36 serves as the primary or main antenna, and TX/RX antenna 32 serves as the diversity or secondary antenna. In such a configuration, the degraded efficiency of antenna 32 can be tolerated, as it serves as the secondary antenna. Baseband modem 24 is typically aware of which role is played by which antenna (antenna 36 serving as main, antenna 32 serving as secondary) and performs the various reception procedures accordingly. During device testing, when a single RX antenna is needed, device 20 selects antenna 36 as the single antenna.

In summary, by adaptively tuning antennas 32 and 36 to the actual TX and RX slices being used, it is possible to optimize the antennas for narrow bandwidth and thus high efficiency. In some embodiments, the instantaneous bandwidth of the adaptively-tunable ESA should match the instantaneous bandwidth of the signal (e.g., 20 MHz in a 20 MHz LTE system) rather than the bandwidth of the entire band.

In other embodiments, the adaptively-tunable ESAs may be generally narrowband, but not necessarily as narrowband as the signal. For example, in an FDD or HFDD application, any antenna bandwidth that is narrower than the applicable band (TX or RX) plus the guard band is considered narrowband. In a TDD application, any antenna bandwidth that is narrower than the applicable band (TX or RX) is considered narrowband.

In the context of the present disclosure, signal bandwidths and antenna bandwidths are typically measured as 3 dB-bandwidths. Alternatively, however, any other suitable convention can be used.

Example Antenna Tuning Schemes

In various embodiments, any suitable tuning scheme or circuitry may be used for adaptively tuning ESAs 32 and 36. Some tuning schemes, referred to as impedance matching or RF matching, aim to optimize the power transfer from the transmission line to the antenna by matching the antenna impedance to the impedance of the preceding RF circuitry.

In the examples of FIGS. 1 and 2, the antennas are tuned using RF Matching Networks (MNs) that are controlled by control unit 56. In an embodiment, control unit 56 adjusts the MNs in a closed-loop process that aims to minimize the Voltage Standing Wave Ratio (VSWR) of the antennas. Unit 56 may estimate the VSWR, for example, by assessing the ratio between the forward power level (power transmitted to the antenna) and reverse power level (power reflected from the antenna), as sensed by directional coupler 48.

In various embodiments, MNs 34 and 38 may be implemented using any suitable MN topology. In some cases it is possible to select the MN topology based on the specific type of antenna, knowledge regarding the antenna characteristics over frequency, and/or knowledge or assumptions regarding expected body effects. For example, it may be known that the antenna impedance is expected to vary only over a known range of impedances (e.g., over a specific region of the Smith chart). This knowledge can be used in the MN design for simplifying the MN, reduce losses and enable faster convergence and smaller look-up tables in control unit 56. In some embodiments the MN can be simplified to a single inductor-capacitor (LC), capacitor-capacitor (CC) or capacitor-inductor (CL) L-shaped MN, or to a T-shaped or Pi-shaped MN.

Other tuning schemes, sometimes referred to as aperture tuning, aim to optimize the radiation efficiency from the antenna terminals to free space. These tuning schemes typically modify the antenna aperture and/or resonance frequency. In some embodiments, aperture tuning may be implemented by coupling to the antenna a tunable element controlled by control unit 56. A tunable element may comprise, for example, a switched capacitor, a tunable capacitor (e.g., barium-strontium-titanate (BST) capacitor), or a Micro Electro-Mechanical System (MEMS) device. As yet another example, the tuning scheme may involve adaptively connecting and disconnecting one or more antenna elements. Further additionally or alternatively, any other suitable tuning scheme can be used.

In the description above, the adaptive tuning process of control unit 56 aims to optimize the antenna performance (e.g., efficiency) in the frequency slice of interest. In addition, control unit 56 may use the tuning process to compensate for various effects that distort the antenna performance, e.g., body effects due to proximity of the user body or other objects to the antenna.

In various embodiments, control unit 56 may tune one or more of the adaptively-tunable ESAs based on any suitable metric or combination of metrics. Example metrics comprise:

TX antenna VSWR measurement, as explained above
Properties of the RX signal such as, for example, Received Signal Strength Indication (RSSI) for each antenna, Reference-Signal Received Power (RSRP) for each antenna, correlation between RX antennas, reference signal phase difference, estimated noise/interference level in each RX antenna and/or RX signal Modulation and Coding Scheme (MCS).
Properties of the TX signal, such as, for example, TX signal power headroom.
Inputs from proximity detectors, indicative of nearby objects.
Inputs from bio sensors, e.g., heart rate, temperature, skin moisture, blood saturation and others. In a smart-watch application, for example, such sensors may enable control unit 56 to verify whether the wireless device is worn on the user body or lying on a table, and also to determine the position of the watch.
Inputs from motion sensors. In a smart-watch application, for example, such inputs may be indicative of whether the device is static, on which hand the device is worn and its orientation (e.g., front/back of the forearm).
Microphone/Speaker activity sensor. If the microphone and speaker are activated during a call, the device is likely to be held next to the user's head.
Charger connection sensor.

As noted above, in some embodiments control unit 56 may tune TX/RX ESA 32 while permitting a certain degradation in the ESA's reception performance in the RX band. In some embodiments, control unit 56 may set the amount of permissible degradation depending on one or more of the above metrics, or based on other suitable metrics. Control unit 56 may also use the above metrics, for example, to decide when tuning is needed, and in which direction to tune.

In an alternative embodiment, control unit 56 may tune TX/RX ESA 32 while balancing between TX and RX performance, based on one or more of the above metrics or other suitable metrics. This tuning scheme may be useful, for example, in device 58 (having a single antenna) operating in FDD.

Non-FDD Embodiments

The description above mainly addressed FDD applications. The disclosed techniques, however, are also applicable and advantageous in other duplex schemes, such as Time-Division Duplex (TDD) and Half-duplex FDD (HFDD). In a TDD application, for example, transmission and reception are performed on the same frequency, in alternating time periods. In such a protocol, a single TX/RX antenna can be used, such as in device 58 of FIG. 2. Control unit 56 may adaptively tune TX/RX ESA 32 to the applicable TX/RX frequency. As another example, a TDD device may use two antennas as in device 20. In this embodiment, both antennas may be narrowband and tuned by control unit 56 using similar criteria.

In HFDD, transmission and reception are performed on different frequencies, but in alternating time periods and not simultaneously. The techniques described above with reference to FDD can be used in FDD, as well. In some embodiments, control unit 56 may adaptively tune ESA 32 depending on whether the device currently transmits or receives. In other words, the control unit may switch the ESA to a TX-optimized tuning scheme during transmission, and to an RX-optimized tuning scheme during reception. Typically, the TX-optimized scheme tunes the center frequency of the antenna to a suitable frequency in the TX band, and the RX-optimized scheme tunes the center frequency of the antenna to a suitable frequency in the RX band.

In another embodiment, an HFDD device may use two antennas as in device 20. In this embodiment, control unit 56 may alternate TX/RX ESA 32 between a TX-optimized tuning scheme during transmission, and an RX-optimized tuning scheme during reception. The center frequency of RX-only ESA 36, on the other hand, may be retained constant in the RX band.

Automatic Antenna Tuning Based on Received-Signal Analysis

In some embodiments of the present invention, control unit 56 tunes one or more of the adaptively-tunable antennas of the wireless device based on analysis of the signal received from the remote transmitter. The tuning schemes described below can be used with any of the wireless device configurations of FIGS. 1-3 above, or with any other suitable configuration.

The disclosed tuning schemes can also be used with any suitable adaptively-tunable antenna, such as, for example, the antenna configurations described above. Although the embodiments described herein refer mainly to electrically-small antennas, the disclosed techniques are not limited to such antennas and can be used for tuning of any other suitable antenna type.

Figure 5:
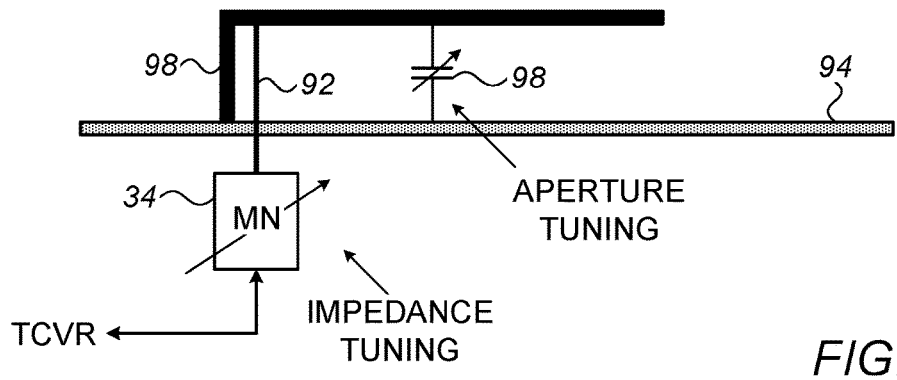
FIG. 5 is a block diagram that schematically illustrates impedance tuning and aperture tuning of an electrically-small antenna, in accordance with an embodiment of the present invention.

FIG. 5 is a block diagram that schematically illustrates impedance tuning and aperture tuning of an antenna, in accordance with an embodiment of the present invention. The figure shows an example antenna that comprises a radiating element 98 mounted over a ground plane 94 and fed by a feedline 92.

In this example, a tunable matching network (MN) 34 matches the output impedance of the antenna to the input impedance of the preceding RF circuitry. Impedance matching using MN 34 is performed based on the received signal. A tunable capacitor 98 is an example of a tunable element that performs aperture tuning, i.e., tunes the resonance frequency of the antenna. Aperture tuning using capacitor 98 (or other tunable element) is performed based on the received signal.

Any setting of MN 34 and/or capacitor 98 (or other tunable element) is referred to herein as an antenna tuning setting. In the present example both MN 34 and capacitor 98 are controlled by control unit 56, so as to apply and test various tuning settings. In alternative embodiments, the tuning scheme may apply only impedance tuning or only aperture tuning. MN 34, capacitor 98 and/or any other tuning component or circuitry are referred to herein as a tunable element whose tuning changes the response of the antenna.

The following description tuning. MN 34, capacitor and/or any other tuning component or circuitry are referred to herein as a tunable element whose tuning changes the response of the antenna.

The following description outlines several implementation examples of antenna tuning schemes that are based on received-signal analysis. The examples below refer mainly to receivers operating in accordance with the Third-Generation Partnership Project (3GPP) In Long-Term Evolution (LTE) specifications, by way of example. Alternatively, the disclosed techniques can be used with receivers operating in accordance with any other suitable communication or location standard or protocol. Example protocols comprise Universal Mobile Telecommunications System (UMTS), Global System for Mobile communications (GSM), Code-Division Multiple Access (CDMA), Wireless Local Area Network (WLAN) standards such as IEEE 802.11 and Bluetooth, GPS, Glonass among others.

Antenna Tuning During Active Reception

In some embodiments, control unit 56 tunes the antenna during time periods in which the receiver receives and demodulates a desired signal. In LTE, for example, such time periods may be times during which the wireless device operates in the RRC_CONNECTED mode. Since antenna tuning changes the antenna complex gain, it may distort the amplitude and/or phase of the received signal. Therefore, care should be taken when tuning is performed during continuous reception periods.

In an embodiment, the received signal comprises a sequence of time frames (denoted sub-frames in LTE), and unit 56 applies tuning changes to the antenna only during boundaries between successive time frames.

In an embodiment, unit 56 decides on the appropriate tuning changes by performing measurements on known parts of the received signal in order to estimate the received signal level, and the slope of the received signal level as a function of frequency. These two parameters are indicative of the antenna response, and the slope of the antenna response as a function of frequency.

In the present context, the term "known part of the signal" refers to parts of the signal whose bit values are fixed (or at least semi-fixed, e.g., remain fixed for long time duration with high probability), or otherwise known to the receiver in advance regardless of success of demodulation or decoding. Such known signals may comprise, for example, various types of Reference Signals (RS) and synchronization signals such as cell-specific reference signals, Positioning Reference Signals (PRS), Physical Broadcast Channels (PBCH), Secondary Synchronization Signal (SSS), Primary Synchronization Signal (PSS), Master Information Blocks (MIB) and System Information Blocks (SIB), to name just a few examples.

In addition, it is possible to process not only serving cell signals but also known signals from a neighbor cell operating on the same frequency as the serving cell. This technique can boost performance, for example, under limited signal-to-noise ratio conditions. Another kind of signal that can be used for antenna tuning is data subframes having repetition: Once the signal is successfully decoded, the other repeating subframes are known and can be used for processing.

By using the known values of such signals, unit 56 is able to obtain high-accuracy signal-level and slope measurements. For example, unit 56 may calculate the convolution between the received known signal and the expected known bit sequence. Such a convolution has high processing gain, allowing accurate signal-level measurement.

In the present context, the term "antenna response" refers to the transfer function of the antenna as it is applied to the received signal. The antenna response is correlative, for example, with the total antenna efficiency and the antenna gain. All of these parameters can be examined at a particular frequency or as a function of frequency. The terms "antenna response," "antenna gain" and "antenna efficiency" are sometimes used interchangeably herein. The antenna response values and their slope over frequency are typically used by unit 56 in determining the desired adjustments to the antenna tuning.

In a typical implementation, unit 56 tunes the antenna in an iterative process that aims to maximize the received signal level, i.e., maximize the estimates antenna response for the particular received signal. In each iteration, unit 56 estimates an adjustment to be applied to the antenna tuning, based on the measured slope of the antenna response.

In some embodiments, the adjustment comprises a frequency adjustment to be applied to the center frequency of the antenna. This frequency adjustment is made-up of a direction (i.e., a decision whether to increase or decrease the center frequency) and a size (i.e., frequency shift in the determined direction). In other embodiments, the adjustment comprises a direct adjustment to be applied to the tuning elements of the antenna (e.g., to MN 34 or to capacitor 98 of FIG. 5), without explicitly estimating the resulting frequency adjustment. Further alternatively, any other suitable type of adjustment can be used.

Typically, the signal levels measured by unit 56 are relative. In other words, unit 56 may not be able to interpret the absolute signal levels, but rather to compare different settings of the antenna tuning elements and decide which setting yields a higher received signal level.

When performing such relative measurements, care should be taken to perform the measurements under similar channel conditions. In an example embodiment, when measuring two tuning settings that are to be compared with one another, unit 56 performs one measurement on the last RS of a certain subframe, and the second measurement on the first RS of the following subframe. The time proximity between the measurements reduces the possible effects of channel fading. Alternatively, other suitable measurement times, which are in close time proximity to one another, can be used.

Typically, the received signal occupies a certain bandwidth, e.g., on the order of 10 KHz to several tens of MHz, depending on the communication standard. In an embodiment, unit 56 measures the received level of known signals (e.g., RS) at several frequencies across the received signal bandwidth. These relative measurements provide an estimate of the slope of the antenna response as a function of frequency across the received signal bandwidth. Unit 56 uses the estimated slope to determine the appropriate direction and size of the adjustment to the antenna tuning setting. In an embodiment, unit 56 deduces the direction of adjustment from several slope measurements performed with different antenna tuning settings.

The description above referred to measurements that are based on known signals. In alternative embodiments, unit 56 may also measure the signal level and slope based on signal parts that carry user data or other data that is not known in advance. For example, unit 56 may decode a data signal, extract the error-corrected information bits from the signal, and then re-encode the data symbols. The re-encoded symbols can be regarded as a more accurate version of the received signal that suffers little or no distortion due to read errors. Thus, unit 56 may estimate the antenna response from the re-encoded symbols.

Antenna Tuning During Intermittent Reception

In some embodiments, control unit 56 tunes the antenna during time periods in which the receiver operation is intermittent. In such scenarios, the receiver is typically controlled to wake-up and decode signals at a low duty-cycle, and to sleep and save power otherwise. In LTE, for example, the wireless device may operate in a Discontinuous Reception (DRX) state or in paging state, e.g., in RRC_IDLE mode. The sleep time intervals between successive wake-up periods may be long, e.g., up to 2.56 seconds for LTE release 11 and below, and several minutes to hours in advanced standards.

Since the antenna response may change from one wake-up period to the next, e.g., due to body effects, it is desirable to keep tuning the antenna during the sleep intervals between wake-up periods. When implementing antenna tuning during intermittent reception, care should be taken to minimize power consumption, which is a prime consideration in such scenarios.

On the other hand, since the receiver does not perform actual data demodulation between wake-up periods, unit 56 is free to test tuning settings at any suitable time during the sleep intervals. Unit 56 may change the timing of the measurements as needed, e.g., depending on received signal level and/or sleep interval and wake-up period durations.

In an example embodiment, during intermittent reception, unit 56 changes antenna tuning settings during data symbols that do not contain known signals (e.g., during data symbols that do not contain RS), and performs signal-level measurements during symbols that do contain known signals (e.g., RS symbols). As noted above, since the RS are known signals, convolution between the received RS and the expected known bit sequence has high processing gain, allowing accurate signal-level measurement.

Figure 6:
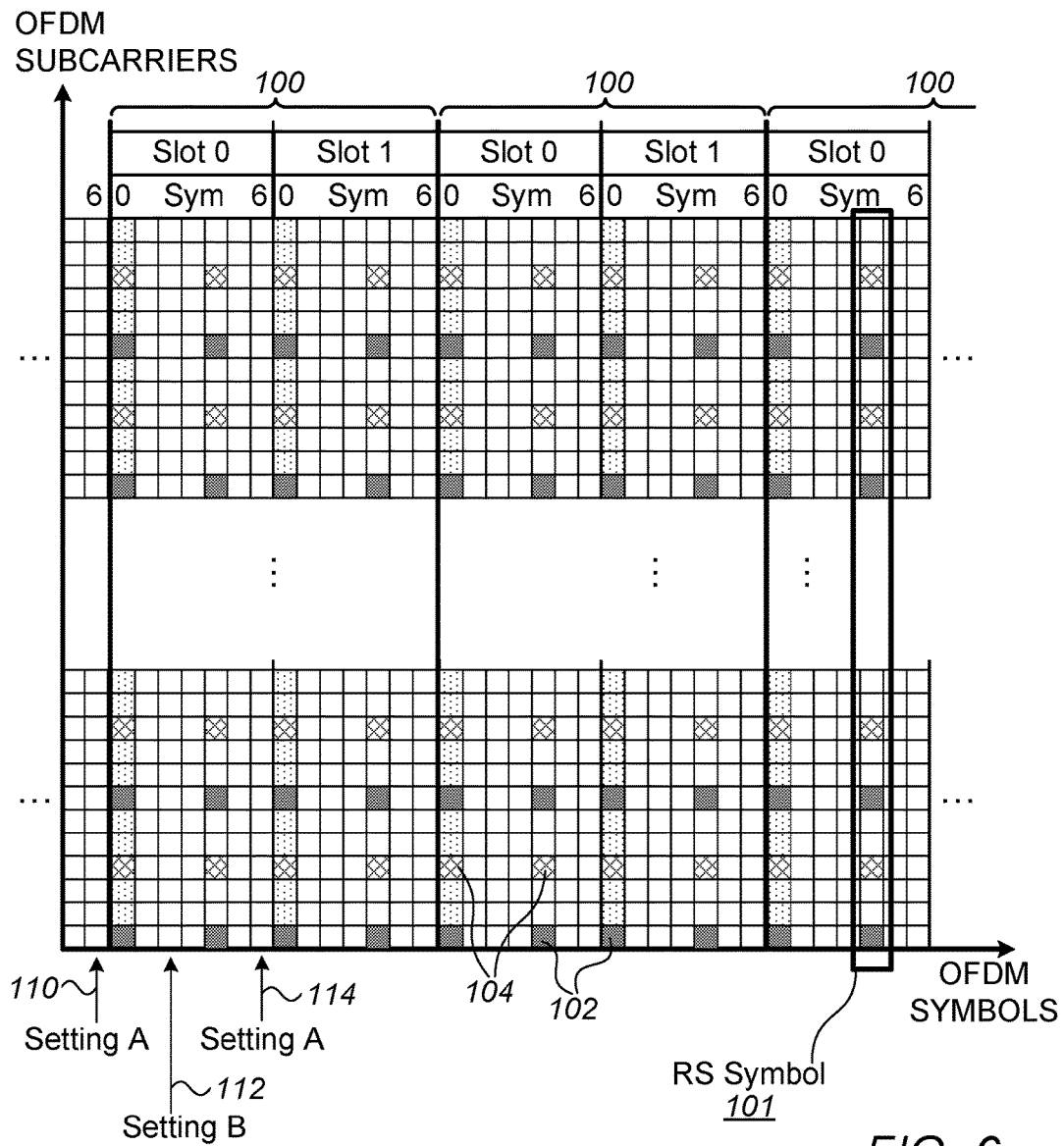
FIG. 6 is a diagram illustrating the use of an Orthogonal Frequency Division Multiplexing (OFDM) signal for antenna tuning, in accordance with an embodiment of the present invention.

FIG. 6 is a diagram illustrating an LTE OFDM signal received by the wireless device from a base station (eNodeB), and the way the is used for antenna tuning, in accordance with an embodiment of the present invention. The horizontal axis is a time axis in units of OFDM symbol intervals. The vertical axis is a frequency axis, in units of OFDM subcarrier bandwidth. In the present example, each symbol is approximately 71.3 μsec long, and the subcarriers are spaced 15 KHz apart.

Each time-frequency unit (one subcarrier over one symbol interval) is referred to herein as a time-frequency bin. The overall received signal bandwidth may be, for example, between 180 KHz and 18 MHz. On the time axis, the signal is divided into subframes 100. Each subframe is divided into two time slots denoted "slot 0" and "slot 1", and each slot comprises six OFDM symbols numbered 0 . . . 6.

Some of the OFDM symbols in the received signals carry RSs in some of their time-frequency bins. One such symbol is marked 101 in the figure. Other symbols do not carry RSs at all. In the present example, the signal has been transmitted by the base station from two antenna ports referred to as TX0 and TX1. A separate pattern of RSs is transmitted via each antenna port—RS 102 for TX0 (marked by dark shading in the figure), and RS 104 for TX1 (marked by cross-hatching). This transmission pattern is depicted purely by way of example. Any other suitable pattern can be used.

In the present example, symbols 0 and 4 in every slot are RS symbols 101. In each RS symbol, RSs (of either TX0 or TX1) are received on every third subcarrier. The remaining time-frequency bins of the received signal may be used for transmitting data channels or other channel types, either to the wireless device or to other devices. The signal pattern of FIG. 6 is an example pattern that is depicted purely by way of example. The disclosed techniques can be used with any other suitable signal structure.

In some embodiments, in order to reduce the sensitivity to channel fading, control unit 56 measures the antenna response as follows. Unit 56 compares two antenna tuning settings denoted A and B. A is regarded as a reference or baseline setting. Unit 56 attempts to decide whether setting B is better or worse than setting A. This operation may be performed, for example, in a given iteration of an iterative tuning process that aims to maximize the received signal level.

In the present example, unit 56 sets the antenna tuning elements to setting A at a time 110, and performs a measurement (under setting A) on the reference signals in the RS symbol that follows. Then, at a time 112, unit 56 switches to setting B and performs a measurement (under setting B) on the reference signals in the RS symbol that follows. At a time 114, unit 56 switches back to setting A and again performs a measurement (under setting A) on the reference signals in the RS symbol that follows. As explained above, changing the tuning setting is performed during data (i.e., non-RS) symbols, whereas signal-level measurements are performed during RS symbols.

In the example above, unit 56 measures setting A before and after measuring setting B, and considers both measurements of setting A in the comparison with setting B. This mechanism helps to minimize distortion caused by channel fading. In an embodiment, unit 56 interpolates the results of the two measurements of setting A, and compares the interpolation result with the measurement of setting B. Thus, unit 56 interpolates the first and third RS symbols (symbol 0 of slot 0 and symbol 0 of slot 1). This interpolation approximates the result that setting A would have yielded on symbol 4 of slot 0 (on which setting B is measured).

In alternative embodiments, unit 56 may interpolate a larger number of measurements of RS symbols, and/or measure a larger number of possible settings, in order to improve the measurement accuracy. In some embodiments, e.g., in slow fading scenarios, it may be sufficient to compare symbol 0 of slot 0 (under setting A) and symbol 4 of slot 0 (under setting B), i.e., refrain from measuring setting A twice.

In addition to measuring signal level, unit 56 may also measure the slope of the antenna response as a function of frequency for a given antenna tuning setting. The slope may be indicative of how well the antenna is currently tuned, and/or in which direction and/or by what increment the antenna center frequency should be adjusted.

Unit 56 typically measures the slope by estimating the relative measured amplitudes of the different RSs in the RS symbol. In the signal of FIG. 6, for example, a given RS symbol contains RSs (102 or 104) on every third subcarrier across the signal bandwidth. Measuring the relative amplitudes of the RSs in the symbol provides the slope (or other characteristic) of the antenna response as a function of frequency.

In addition to the slope in a given setting, unit 56 may also estimate the change in slope between tuning settings. The change in slope between different tuning settings provides information for a wider bandwidth, and may provide a more accurate indication of the amplitude and direction of the desired adjustment.

Figure 7:
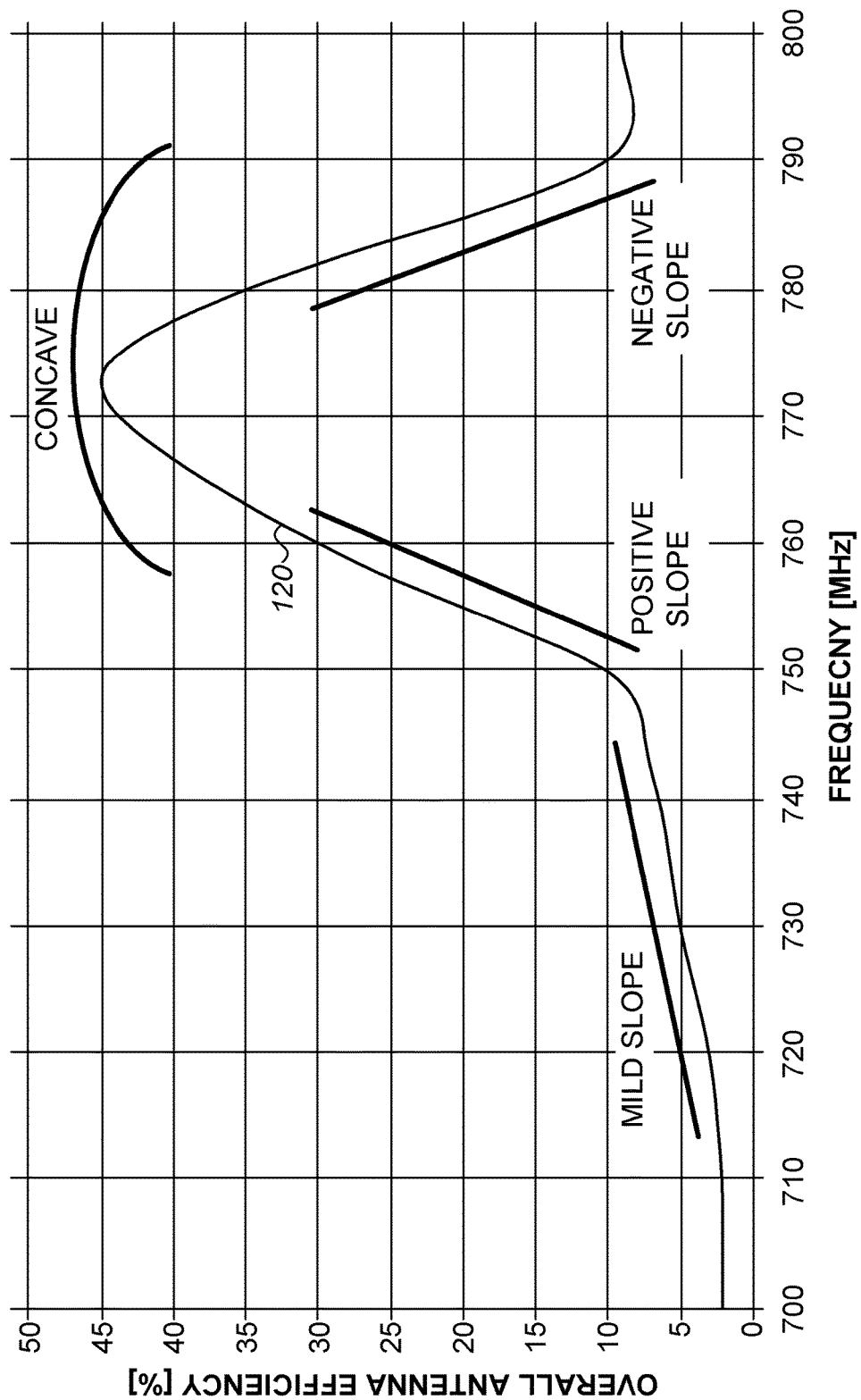
FIG. 7 is a graph that schematically illustrates antenna tuning based on the slope of estimated antenna efficiency as a function of frequency.

FIG. 7 is a graph that schematically illustrates antenna tuning based on the slope of estimated antenna efficiency as a function of frequency. A graph 120 plots the overall antenna efficiency as a function of frequency for a given antenna tuning setting. The current setting, for example, is well tuned to receive a signal around a center frequency of ~772.5 MHz.

In most practical cases, the slope across a given channel bandwidth may be roughly classified as flat, mild positive, mild negative, steep positive, steep negative or concave. A concave slope typically indicates that the antenna is tuned or nearly tuned, and that only minor adjustments may be required. A steep positive slope typically indicates that the antenna center frequency should be reduced. A steep negative slope typically indicates that the antenna center frequency should be increased. A mild slope may either indicate that the antenna is tuned, or that the tuning is completely off-mark so that large tuning steps are needed.

During intermittent reception (e.g., DRX or paging cycles), unit 56 may use various criteria to decide when it is time to wake-up the receiver in order to evaluate (and possibly adjust) the antenna tuning setting. The wake-up criterion may consider, for example, the value of the most recent Reference Signal Received Power (RSRP) or Reference Signal Received Quality (RSRQ). If the received signal was strong, the antenna tuning may be tracked with reduced accuracy and less frequently.

As another example, the wake-up criterion may consider low-current sensors of the wireless device, such as proximity sensor, acceleration sensor, gyroscope and/or touch-screen. In an embodiment, unit 56 initiates tuning of the antenna in response to environmental changes sensed by these sensors. Such changes may indicate, for example, changes in body effects that warrant re-tuning of the antenna.

As yet another example, the wake-up criterion may consider the duration of inactivity of the wireless device. A long duration of inactivity typically indicates a higher need for verifying the antenna tuning prior to actual reception, and vice versa. Further alternatively, unit 56 may consider any other suitable parameter in deciding when to activate the receiver and evaluate the antenna tuning setting.

The description above refers to two tuning scheme, one used during continuous reception and the other used during intermittent reception. In some embodiments, control unit 56 is aware of the current operational mode of the wireless device and of transitions between modes. Unit 56 may select one of the two tuning schemes using this information.

Additional Embodiments and Variations

In the example of FIG. 6 above, unit 56 switches between different tuning settings between RS symbols, and measures the antenna response during RS symbols. In such an implementation, a given RS symbol is typically used in its entirety for evaluating a given tuning setting. If, however, the processing gain provided by the RS is large enough, it is possible to switch between settings during a given RS symbol, and thus use a given RS symbol for evaluating more than a single tuning setting. Such a scheme is faster and more resilient under fast fading scenarios.

In LTE, for example, the RS sequence is padded with zeros and is periodic in the time domain. Therefore, it is possible to split the RS symbol (in time) into several measurements and in this way speed-up the measurement process. The periodicity in the time-domain of the LTE RS is one third of the OFDM symbol time. Thus, for example, unit 56 may measure setting A during the first third of the RS symbol, switch to setting B during the second third of the RS symbol, and measure setting B during the third of the RS symbol. Unit 56 may then correlate the results of the two measurements, and average the correlation result so as to produce the desired direction of tuning.

In some embodiments, unit 56 attempts to find a suitable tuning scheme during initial acquisition of the base station signal by the receiver. In an embodiment, during initial acquisition, unit 56 may attempt to scan over several settings of the tuning elements that sufficiently cover the potential variation of the antenna resonance frequency. The initial acquisition process may start at these nominal settings. If no signal is found, other settings can also be searched, e.g., starting with the higher-probability setting. Once a base station signal is found (e.g., a PSS signal), finer tuning can be performed using the iterative process described above. Initial tuning can also be performed on any signal found during the initial search.

At a given point in time, the wireless device is served by a certain base station on a certain frequency, and thus has good knowledge of the optimal antenna tuning setting for this frequency. At some point the device may search for an alternative base station on a different frequency. In some embodiments, control unit 56 may use the known tuning setting of the current serving base station to estimate the tuning setting for the frequency of the new base station (due to expected correlation between the frequency shifts).

The above mechanism is mostly applicable to intra-band cell search, i.e., when the current base station and the new base station operate in the same frequency band. For inter-frequency inter-band search (i.e., when the current base station and the new base station operate in different frequency bands), depending on frequency difference and characteristics of the antenna, either the above-described initial acquisition process or the above-described intra-band estimation process can be used.

In some embodiments, control unit 56 applies both the disclosed (reception-based) tuning schemes, as well as transmission-based tuning schemes that tune the antenna based on the transmitted signal. The reception-based tuning yields a tuning setting referred to as "RX setting," and the transmission-based tuning yields a tuning setting referred to as "TX setting." At a given point in time, control unit 56 may choose between the RX and TX settings, or combine the two settings, e.g., depending on the communication protocol being used.

For example, in FDD operation, for an RX-only antenna unit 56 uses the RX setting estimated for that antenna. For a TX/RX antenna, unit 56 uses either the TX setting, or the RX setting, or a setting that compromises between the two, to match the applicable user scenario. For example, for reception-intensive scenarios (e.g., file download or video streaming), higher weight may be given to the RX scheme, and vice versa. The compromise may also depend on channel conditions. For example, when reception is interference-limited, the RX setting may be of little benefit. The TX setting, on the other hand, may be more power efficient.

In HFDD operation, during reception unit 56 uses the RX setting. During transmission unit 56 uses the TX setting if one exists, or estimates an approximate TX setting based on the RX setting. In TDD operation, since both transmission and reception are performed on the same frequency, unit 56 may use the RX setting at all times, and transmission-based tuning may be omitted altogether.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
receiving from a remote transmitter a signal that occupies an actual frequency slice selected from among multiple frequency slices within a reception band, via an electrically-tunable antenna having a tunable instantaneous bandwidth that is narrower than the reception band;
calculating, by analyzing the received signal, an adjustment that tunes a frequency-response of the electrically-tunable antenna to the actual frequency slice selected within the reception band from among the multiple frequency slices; and
tuning the frequency-response of the electrically-tunable antenna to the actual frequency slice, responsively to the calculated adjustment, by tuning a tunable element in the electrically-tunable antenna.

2. The method according to claim 1, wherein calculating the adjustment and tuning the frequency-response comprise carrying out an iterative tuning process that aims to maximize a level of the received signal.

3. The method according to claim 1, wherein the received signal comprises known signal components, and wherein calculating the adjustment comprises deriving the adjustment from measured received levels of the known signal components.

4. The method according to claim 1, wherein calculating the adjustment comprises estimating a slope of the frequency-response as a function of frequency over a frequency range, and deriving the adjustment from the estimated slope.

5. The method according to claim 1, wherein calculating the adjustment comprises estimating a change in a slope of the frequency-response as a function of frequency between at least first and second settings of the tunable element, and deriving the adjustment from the estimated change in the slope.

6. The method according to claim 1, wherein calculating the adjustment comprises measuring respective levels of the received signal for at least first and second settings of the tunable element, and deriving the adjustment by comparing the received levels.

7. The method according to claim 1, wherein receiving the signal comprises operating a receiver that receives the signal in an intermittent reception mode, and comprising waking-up the receiver in order to calculate the adjustment in response to meeting a predefined wake-up criterion.

8. The method according to claim 1, and comprising calculating, based on the tuned frequency-response, an antenna tuning setting to be used for signal transmission.

9. Apparatus, comprising:
an electrically-tunable antenna comprising a tunable element and having a tunable instantaneous bandwidth that is narrower than a reception band;
a receiver configured to receive, from a remote transmitter via the electrically-tunable antenna, a signal that occupies an actual frequency slice selected from among multiple frequency slices within the reception band; and
control circuitry, which is configured to:
calculate, by analyzing the received signal, an adjustment that tunes a frequency-response of the electrically-tunable antenna to the actual frequency slice selected within the reception band from among the multiple frequency slices; and
tune the frequency-response of the electrically-tunable antenna to the actual frequency slice, responsively to the calculated adjustment, by tuning the tunable element in the electrically-tunable antenna.

10. The apparatus according to claim 9, wherein the control circuitry is configured to calculate the adjustment and tune the frequency-response in an iterative tuning process that aims to maximize a level of the received signal.

11. The apparatus according to claim 9, wherein the received signal comprises known signal components, and wherein the control circuitry is configured to derive the adjustment from measured received levels of the known signal components.

12. The apparatus according to claim 9, wherein the control circuitry is configured to estimate a slope of the frequency-response as a function of frequency over a frequency range, and to derive the adjustment from the estimated slope.

13. The apparatus according to claim 9, wherein the control circuitry is configured to estimate a change in a slope of the frequency-response as a function of frequency between at least first and second settings of the tunable element, and to derive the adjustment from the estimated change in the slope.

14. The apparatus according to claim 9, wherein the control circuitry is configured to measure respective levels of the received signal for at least first and second settings of the tunable element, and to derive the adjustment by comparing the received levels.

15. The apparatus according to claim 9, wherein, when the receiver operates in an intermittent reception mode, the control circuitry is configured to wake-up the receiver in order to calculate the adjustment in response to meeting a predefined wake-up criterion.

16. The apparatus according to claim 9, wherein the control circuitry is configured to calculate, based on the tuned frequency-response, an antenna tuning setting to be used for signal transmission.

17. A method, comprising:
receiving a signal from a first base station on a first frequency in a reception band, via an electrically-tunable antenna having a tunable instantaneous bandwidth that is narrower than the reception band;
calculating, by analyzing the received signal, an adjustment that tunes a frequency-response of the electrically-tunable antenna to an actual frequency slice that is selected from among multiple frequency slices within the reception band for use by a second base station, wherein calculating the adjustment comprises predicting a setting of a tunable element in the electrically-tunable antenna to be used when receiving a subsequent signal from the second base station in the actual frequency slice; and
tuning the frequency-response of the electrically-tunable antenna to the actual frequency slice, responsively to the calculated adjustment, by tuning the tunable element in the electrically-tunable antenna.

18. Apparatus, comprising:
an electrically-tunable antenna comprising a tunable element and having a tunable instantaneous bandwidth that is narrower than a reception band;
a receiver configured to receive a signal from a first base station on a first frequency in the reception band, via the electrically-tunable antenna; and
control circuitry, which is configured to:
calculate, by analyzing the received signal, an adjustment that tunes a frequency-response of the electrically-tunable antenna to an actual frequency slice that is selected from among multiple frequency slices within the reception band for use by a second base station, wherein calculating the adjustment comprises predicting a setting of the tunable element in the electrically-tunable antenna to be used when receiving a subsequent signal from the second base station in the actual frequency slice; and
tune the frequency-response of the electrically-tunable antenna to the actual frequency slice, responsively to the calculated adjustment, by tuning the tunable element in the electrically-tunable antenna.

* * * * *